(12) United States Patent
Nie et al.

(10) Patent No.: US 11,342,478 B2
(45) Date of Patent: *May 24, 2022

(54) SAPPHIRE COLLECTOR FOR REDUCING MECHANICAL DAMAGE DURING DIE LEVEL LASER LIFT-OFF

(71) Applicant: Lumileds LLC, San Jose, CA (US)

(72) Inventors: Dong Nie, Singapore (SG); Kian Hock Tee, Singapore (SG)

(73) Assignee: Lumileds LLC, San Jose, CA (US)

(*) Notice: Subject to any disclaimer, the term of this patent is extended or adjusted under 35 U.S.C. 154(b) by 418 days.

This patent is subject to a terminal disclaimer.

(21) Appl. No.: 15/573,828

(22) PCT Filed: May 13, 2016

(86) PCT No.: PCT/EP2016/060458
§ 371 (c)(1),
(2) Date: Nov. 13, 2017

(87) PCT Pub. No.: WO2016/180831
PCT Pub. Date: Nov. 17, 2016

(65) Prior Publication Data
US 2018/0261715 A1 Sep. 13, 2018

Related U.S. Application Data

(60) Provisional application No. 62/160,814, filed on May 13, 2015.

(51) Int. Cl.
*H01L 33/00* (2010.01)
*B23K 26/00* (2014.01)
(Continued)

(52) U.S. Cl.
CPC ...... *H01L 33/0093* (2020.05); *B23K 26/0006* (2013.01); *B23K 26/57* (2015.10);
(Continued)

(58) Field of Classification Search
CPC ............ H01L 33/0079; H01L 21/7806; H01L 21/6838; H01L 33/0093; B23K 26/0006;
(Continued)

(56) References Cited

U.S. PATENT DOCUMENTS 3,482,755 A * 12/1969 Raciti .................. B23K 3/0653
228/34
3,626,141 A * 12/1971 Daly ...................... B23K 26/16
219/121.68
(Continued)

FOREIGN PATENT DOCUMENTS

EP 1433563 A2 6/2004
JP 10-113786 A 5/1998
(Continued)

OTHER PUBLICATIONS

Kelly et al., "Optical Process for Liftoff of Group III-Nitride", Physica Status Solidi, Rapid Research Note, Walter Schottky Insitut, Technische Universitat Muchen, Nov. 28, 1996, pp. 1-2.

*Primary Examiner* — Eric S Stapleton
(74) *Attorney, Agent, or Firm* — Volpe Koenig (57) ABSTRACT

In a Sapphire Collector (SC), one or more features, both structural and parametric, are included for capturing the die-size sapphire chips that are removed from a semiconductor structure during die-level laser lift-off (LLO). These features are designed to increase the likelihood that each sapphire chip is securely captured by the Sapphire Collector immediately after it is released from the semiconductor structure.

9 Claims, 5 Drawing Sheets

(51) Int. Cl.
  *B23K 26/70* (2014.01)
  *H01L 21/78* (2006.01)
  *B23K 26/142* (2014.01)
  *H01L 21/683* (2006.01)
  *B23K 26/57* (2014.01)

(52) U.S. Cl.
  CPC ........ *B23K 26/702* (2015.10); *H01L 21/6838* (2013.01); *H01L 21/7806* (2013.01)

(58) Field of Classification Search
  CPC .... B23K 26/702; B23K 26/57; B23K 26/356; B23K 26/0622; B23K 26/142; B23K 2103/172; B23K 2103/50; B23K 2101/40; B23K 2101/42
  USPC .................................................. 219/121.84
  See application file for complete search history.

(56) References Cited

U.S. PATENT DOCUMENTS

| | | | | |
|---|---|---|---|---|
| 3,866,398 A * | 2/1975 | Vernon, Jr | ........... | B23K 26/142 134/1.3 |
| 4,166,761 A * | 9/1979 | Aloupis | ................ | G21B 1/23 376/140 |
| 4,315,133 A * | 2/1982 | Morgan | ............ | B23K 26/1488 219/121.84 |
| 4,361,957 A * | 12/1982 | Krotz | .................... | B08B 15/04 227/156 |
| 4,439,012 A * | 3/1984 | Christy | ............. | G02B 17/0694 359/859 |
| 4,837,443 A * | 6/1989 | Young | ................ | G03F 7/70866 250/440.11 |
| 4,897,520 A * | 1/1990 | Carter | .................... | B08B 15/04 219/121.68 |
| 5,237,150 A * | 8/1993 | Karube | ............. | B23K 26/0643 219/121.72 |
| 5,317,589 A * | 5/1994 | Ogawa | ................ | H01S 3/0818 372/101 |
| 5,359,176 A * | 10/1994 | Balliet, Jr | .......... | B23K 26/1476 219/121.67 |
| 5,425,812 A * | 6/1995 | Tsutahara | ............ | C23C 16/4412 118/715 |
| 5,504,301 A * | 4/1996 | Eveland | ................. | B23K 26/18 219/121.67 |
| 5,570,384 A * | 10/1996 | Nishida | ................ | B23K 26/032 372/19 |
| 5,598,965 A * | 2/1997 | Scheu | .................... | B23K 1/018 228/6.2 |
| 5,662,762 A * | 9/1997 | Ranalli | ................ | B08B 7/0042 156/707 |
| 5,728,993 A * | 3/1998 | O'Neill | ............. | B23K 26/0604 219/121.67 |
| 5,770,095 A * | 6/1998 | Sasaki | ....................... | C23F 3/00 216/38 |
| 5,780,806 A * | 7/1998 | Ferguson | ............. | B08B 7/0042 134/1 |
| 5,906,760 A * | 5/1999 | Robb | ...................... | B08B 15/00 219/121.67 |
| 5,925,024 A * | 7/1999 | Joffe | ...................... | A61B 18/00 604/313 |
| 5,973,764 A * | 10/1999 | McCullough | ....... | G03F 7/70241 355/30 |
| 5,981,901 A * | 11/1999 | La Rocca | ............ | B23K 26/123 219/121.63 |
| 6,034,343 A * | 3/2000 | Hashimoto | .......... | B23K 26/348 219/74 |
| 6,120,360 A * | 9/2000 | Ball | ..................... | B28D 5/0082 257/E21.505 |
| 6,201,278 B1 * | 3/2001 | Gardner | ............ | H01L 29/66621 257/330 |
| 6,261,859 B1 * | 7/2001 | Ouchi | ................ | H01L 33/0093 438/39 |
| 6,274,399 B1 * | 8/2001 | Kern | ....................... | H01L 33/12 438/22 |
| 6,294,754 B1 * | 9/2001 | Nagura | .............. | B23K 26/0604 219/121.63 |
| 6,440,254 B1 * | 8/2002 | Rich | ....................... | B29C 66/002 156/272.2 |
| 6,491,204 B1 * | 12/2002 | Erdmann | ............... | B23K 1/018 228/22 |
| 6,494,965 B1 * | 12/2002 | Walker | ...................... | B08B 5/02 134/104.2 |
| 6,507,000 B2 * | 1/2003 | Otsubo | .............. | B23K 26/1462 219/121.7 |
| 6,531,682 B1 * | 3/2003 | Guttler | ................ | B23K 26/147 219/121.84 |
| 6,621,045 B1 * | 9/2003 | Liu | .................... | B23K 26/1435 219/121.7 |
| 6,649,440 B1 * | 11/2003 | Krames | ................ | H01L 33/025 257/E33.067 |
| 6,664,504 B2 * | 12/2003 | Bertez | ................ | B23K 26/0608 219/121.84 |
| 6,664,507 B2 * | 12/2003 | Akaba | ................ | B23K 26/0604 219/130.5 |
| 6,797,919 B1 * | 9/2004 | Millard | ................ | B23K 26/123 219/121.84 |
| 6,847,005 B2 * | 1/2005 | Alfille | ................ | B23K 26/073 219/121.72 |
| 6,880,646 B2 * | 4/2005 | Batarseh | ................ | E21B 43/11 166/222 |
| 6,943,050 B2 * | 9/2005 | Kondo | ................ | H01L 27/1266 438/46 |
| 7,044,610 B2 * | 5/2006 | Beyer | ...................... | B08B 15/04 347/22 |
| 7,138,293 B2 * | 11/2006 | Ouellet | ............... | B81C 1/00269 438/106 |
| 7,230,636 B2 * | 6/2007 | Iwasa | ........................ | G03F 7/24 347/227 |
| 7,256,483 B2 * | 8/2007 | Epler | ................... | H01L 33/0093 257/676 |
| 7,300,337 B1 * | 11/2007 | Sun | ........................ | B24B 23/02 451/295 |
| 7,465,945 B2 * | 12/2008 | Tokuda | ................ | G01N 23/225 250/492.1 |
| 7,506,792 B1 * | 3/2009 | Manfroy | ............... | B23K 1/0016 228/41 |
| 7,683,539 B2 * | 3/2010 | Kim | ........................ | H01L 24/82 313/512 |
| 7,910,856 B2 * | 3/2011 | Koseki | ................ | B23K 26/146 219/121.67 |
| 7,947,919 B2 * | 5/2011 | Sukhman | ............ | B08B 7/0042 219/121.67 |
| 8,207,472 B2 * | 6/2012 | Kosmowski | ........... | B23K 26/16 219/121.67 |
| 8,273,587 B2 * | 9/2012 | Basin | ...................... | H01L 33/54 438/26 |
| 8,274,735 B2 * | 9/2012 | Fry | ........................ | G01N 21/71 359/393 |
| 8,426,227 B1 * | 4/2013 | Bibl | ........................ | H01L 33/06 438/27 |
| 8,573,469 B2 * | 11/2013 | Hu | ........................ | H01L 33/08 228/179.1 |
| 8,765,584 B2 * | 7/2014 | Kadowaki | ............... | B82Y 20/00 438/577 |
| 8,998,068 B2 | 4/2015 | Park et al. | | |
| 9,035,279 B2 * | 5/2015 | Hu | ........................ | H01L 24/83 257/13 |
| 9,190,400 B2 * | 11/2015 | Krasulick | ............. | H01L 25/167 |
| 9,259,802 B2 * | 2/2016 | Willey | .................. | A47L 9/2842 |
| 9,700,960 B2 * | 7/2017 | Jeong | .................. | B23K 26/362 |
| 2001/0024878 A1 * | 9/2001 | Nakamura | ........... | B24B 37/046 438/691 |
| 2002/0023907 A1 * | 2/2002 | Morishige | .......... | B23K 26/1462 219/121.85 |
| 2002/0106869 A1 * | 8/2002 | Otsu | ..................... | H01L 21/6838 438/459 |
| 2002/0130116 A1 * | 9/2002 | Lawson | ............ | B23K 26/142 219/121.84 |

(56) References Cited

U.S. PATENT DOCUMENTS

| | | | |
|---|---|---|---|
| 2002/0157246 A1* | 10/2002 | Ogimoto | G02F 1/1303 29/832 |
| 2002/0192059 A1* | 12/2002 | Foster, Jr. | H01L 21/68728 414/403 |
| 2003/0001103 A1* | 1/2003 | Kobayashi | G03F 7/707 250/440.11 |
| 2003/0037804 A1* | 2/2003 | Erdmann | B23K 1/018 134/9 |
| 2003/0211813 A1* | 11/2003 | Kassir | B24B 37/30 451/28 |
| 2004/0140300 A1* | 7/2004 | Yoshikawa | B23K 26/147 219/121.84 |
| 2004/0226927 A1* | 11/2004 | Morikazu | B23K 26/142 219/121.84 |
| 2005/0016970 A1* | 1/2005 | Bayer | B23K 26/348 219/121.46 |
| 2005/0061378 A1* | 3/2005 | Foret | F04F 5/04 137/888 |
| 2005/0064137 A1* | 3/2005 | Hunt | B23K 26/55 428/131 |
| 2005/0269582 A1* | 12/2005 | Mueller | C04B 35/64 257/94 |
| 2006/0105485 A1* | 5/2006 | Basin | G02B 19/0028 438/27 |
| 2006/0172031 A1* | 8/2006 | Babbs | B82Y 40/00 425/385 |
| 2006/0172553 A1* | 8/2006 | Choi | H01L 21/6831 438/780 |
| 2006/0202223 A1* | 9/2006 | Sackrison | H01L 33/22 257/99 |
| 2006/0222481 A1* | 10/2006 | Foree | C23C 16/45521 414/800 |
| 2006/0231853 A1* | 10/2006 | Tanaka | H01L 33/486 257/99 |
| 2006/0281203 A1* | 12/2006 | Epler | H01L 33/0093 438/22 |
| 2007/0056941 A1* | 3/2007 | Murase | B23K 26/142 219/121.84 |
| 2007/0107252 A1* | 5/2007 | Kruckenhauser | B41N 1/12 34/402 |
| 2007/0118246 A1* | 5/2007 | Suzuki | H01L 21/6838 700/218 |
| 2007/0145026 A1* | 6/2007 | Murase | B23K 26/16 219/121.84 |
| 2007/0202623 A1* | 8/2007 | Gao | H01L 33/0093 438/29 |
| 2007/0210045 A1* | 9/2007 | Aso | B23K 26/1476 219/121.71 |
| 2008/0041832 A1* | 2/2008 | Sykes | B23K 26/146 219/121.84 |
| 2008/0067160 A1* | 3/2008 | Suutarinen | B23K 26/123 219/121.86 |
| 2008/0087640 A1* | 4/2008 | Miyairi | B23K 26/142 216/65 |
| 2008/0210675 A1* | 9/2008 | Sasaki | B23K 26/16 219/121.84 |
| 2008/0213978 A1* | 9/2008 | Henry | B08B 7/0092 438/462 |
| 2008/0251504 A1* | 10/2008 | Lu | B23K 26/0608 219/121.64 |
| 2009/0068598 A1* | 3/2009 | Murase | B23K 26/40 430/311 |
| 2009/0175705 A1* | 7/2009 | Nakao | H01L 21/67098 414/196 |
| 2009/0188901 A1* | 7/2009 | Dantus | B23K 26/0853 219/121.76 |
| 2009/0230409 A1* | 9/2009 | Basin | H01L 24/97 257/88 |
| 2009/0285991 A1* | 11/2009 | Kitano | G03F 7/162 427/346 |
| 2009/0294412 A1* | 12/2009 | Kono | B23K 26/032 219/121.6 |
| 2010/0013169 A1* | 1/2010 | Monteen | H01L 21/6838 279/3 |
| 2010/0175828 A1* | 7/2010 | Fan | H01L 21/6838 156/718 |
| 2010/0269853 A1* | 10/2010 | Johnston | B23K 26/364 134/1.1 |
| 2010/0282727 A1* | 11/2010 | Kobayashi | B23K 26/0613 219/121.71 |
| 2010/0309566 A1* | 12/2010 | DeWitt | G02B 17/084 359/729 |
| 2010/0320786 A1* | 12/2010 | Ko | H01L 21/6838 294/64.3 |
| 2011/0042874 A1* | 2/2011 | Aoki | G03F 7/70816 269/20 |
| 2011/0043784 A1* | 2/2011 | Aoki | G03F 7/707 355/72 |
| 2011/0053092 A1* | 3/2011 | Aoki | B65G 49/065 430/319 |
| 2011/0056921 A1* | 3/2011 | Belletti | B23K 26/1476 219/121.67 |
| 2011/0076118 A1* | 3/2011 | Kurita | H01L 21/67259 414/217 |
| 2011/0223696 A1* | 9/2011 | Basin | H01L 24/97 438/26 |
| 2011/0241298 A1* | 10/2011 | Vodanovic | H01L 21/6838 279/3 |
| 2011/0253315 A1* | 10/2011 | George | H01L 21/6838 156/718 |
| 2012/0031147 A1* | 2/2012 | Arai | B23K 26/364 65/182.2 |
| 2012/0176600 A1* | 7/2012 | Falk | G01N 21/65 356/51 |
| 2012/0181454 A1* | 7/2012 | Kubota | B41J 2/442 250/492.1 |
| 2012/0225568 A1* | 9/2012 | Izawa | C03C 23/0025 438/795 |
| 2012/0241649 A1* | 9/2012 | Nishihara | H05G 2/008 250/504 R |
| 2013/0171831 A1* | 7/2013 | Namba | H01L 21/30604 438/748 |
| 2013/0221393 A1* | 8/2013 | Mao | H01L 33/44 257/98 |
| 2013/0277999 A1* | 10/2013 | Schaller | H01L 21/6838 294/186 |
| 2013/0330865 A1* | 12/2013 | Zhu | H01L 33/22 438/29 |
| 2013/0333722 A1* | 12/2013 | Tanaka | B08B 3/003 134/1 |
| 2014/0026351 A1* | 1/2014 | Willey | B08B 5/02 15/300.1 |
| 2014/0097162 A1* | 4/2014 | Jeong | B23K 26/361 219/121.68 |
| 2014/0272322 A1* | 9/2014 | Lee | B05B 12/20 428/192 |
| 2014/0299582 A1* | 10/2014 | Mizuno | B23K 20/02 219/78.02 |
| 2015/0118777 A1* | 4/2015 | Seo | H01L 33/20 438/34 |
| 2017/0274474 A1* | 9/2017 | Nie | B23K 26/0006 |
| 2018/0261715 A1* | 9/2018 | Nie | B23K 26/702 |

FOREIGN PATENT DOCUMENTS

| | | |
|---|---|---|
| JP | 2003-294900 A | 10/2003 |
| JP | 2011-512256 A | 4/2011 |
| JP | 2012-121073 A | 6/2012 |
| JP | 2012-191112 A | 10/2012 |
| JP | 2013-184189 A | 9/2013 |
| JP | 2014-121718 A | 7/2014 |
| JP | 2014-124648 A | 7/2014 |
| JP | 2015-199094 | 11/2015 |
| KR | 20090089161 A | 8/2009 |
| WO | 2009/104886 | 8/2009 |
| WO | 2016/027186 | 2/2016 |

* cited by examiner

SAPPHIRE COLLECTOR FOR REDUCING MECHANICAL DAMAGE DURING DIE LEVEL LASER LIFT-OFF

CROSS-REFERENCE TO RELATED APPLICATIONS

This application is the U.S. National Stage, under 35 U.S.C. § 371, of International Application No. PCT/EP2016/060458, filed May 10, 2016, which claims the benefit of U.S. Provisional Application No. 62/160,814, filed May 13, 2015, the contents of which are hereby incorporated by reference herein.

FIELD OF THE INVENTION

This invention relates to the field of light emitting devices, and in particular to a system that reduces damage to the light emitting devices during laser lift-off of the sapphire substrate upon which the light emitting element is grown.

BACKGROUND OF THE INVENTION

Semiconductor devices, including semiconductor light emitting elements, are formed/grown on a substrate, sapphire wafer substrates being common. In the example of a light emitting element, a GaN nucleation layer may be formed on a sapphire substrate, followed by one or more n-type layers, one or more active layers, and one or more p-type layers. Metallic conductors may be formed through and upon the layers to provide coupling of the n-type and p-type layers to an external source of power to activate the active layer(s) of the light emitting element, via contact pads above the uppermost (p-type) layer.

Because the metallic contact pads are generally opaque or reflective, the light emitting element is designed to emit light from the surface opposite the contact pads and through the substrate. To improve light extraction efficiency, the substrate may be removed, exposing the semiconductor surface. The semiconductor surface may be processed to further enhance the light extraction efficiency. In some cases one or more contact pads may be placed on the light emitting side of the device.

Laser lift-off is a process that is commonly used to remove the sapphire substrate from the light emitting element. A laser pulse is projected through the sapphire substrate and is absorbed by the semiconductor layer at the sapphire-semiconductor interface, producing a localized explosive shockwave, due to the instant thermal decomposition of the semiconductor layer at the interface.

If the laser lift-off (LLO) is performed at the wafer level, the wafer-size sapphire substrate is removed after the whole wafer has been processed. If, on the other hand, the laser lift-off is performed for each individual die, the dies are flip-chip mounted on a sub-mount tile, with the sapphire facing upward. The laser is applied to each die, and the die-size sapphire chips pop up into a "Sapphire Collector" immediately after the laser is incident on each die, leaving the semiconductor structure on the sub-mount tile. The sub-mount tile is subsequently processed to create, for example, lens elements over each die, then sliced/diced to provide the individual light emitting devices.

Between the time that the sapphire is removed and the dies are covered, the relatively fragile semiconductor surface is exposed, and susceptible to mechanical damage. During an example set of production runs, the yield lost to such mechanical damage has been measured to be about 0.236%.

SUMMARY OF THE INVENTION

It would be advantageous to reduce the likelihood of mechanical damage to a light emitting element after laser lift-off.

To better address this concern, in an embodiment of this invention, one or more features, both structural and parametric, are included in a Sapphire Collector (SC) for capturing the die-size sapphire chips that are removed from a semiconductor structure during die-level laser lift-off (LLO). These features are designed to increase the likelihood that each sapphire chip is securely captured by the Sapphire Collector immediately after it is released from the semiconductor structure.

The Sapphire Collector includes a cavity that receives chips that are released from a submount via laser lift-off; a tunnel that provides a vacuum to the cavity and removes the chips from the cavity; and a plurality of air pushers that provide air under pressure to the cavity to push the chips toward the tunnel. In an embodiment of this invention, the cavity includes a lower surface that is substantially level with the submount and has a length between a front wall of the cavity and the tunnel that is at least five times greater than a length of the opening that receives the chips.

In some embodiments, the cavity includes one or more of the following features: an upper surface that includes a sloped segment directly above the opening that ricochets the chips toward the tunnel; one or more mesh walls through which air flows into the tunnel; and a sloped front wall that offsets the air pushers.

The height of the opening in the cavity above the submount surface may be adjusted such that a majority of the chips are oriented to have a major surface within 30 degrees of perpendicular to the air under pressure from the air pusher closest to the opening. In some embodiments, the height is between 5.0 mm and 7.0 mm.

The tunnel vacuum may be relatively low, in some embodiments, not more than −3.0 kPa, preferably not more than −1.5 kPa. The pressure from the air pushers may be relatively high; in some embodiments at least +0.3 MPa, preferably at least +0.4 MPa, with an airflow that is substantially perpendicular to the initial path of the chips. Three or more air pushers may be provided, each having an air blade opening that is at least 0.2 mm high, and 7.0 mm wide.

In an example embodiment of this invention, the yield loss due to mechanical damage after laser lift-off was reduced by over three orders of magnitude, from 0.236% to under 0.0001%.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices and methods are omitted so as not to obscure the description of the present invention with unnecessary detail. Also for simplicity and clarity, the drawings are not presented to scale; certain features are drawn oversized to enable annotations and other elements that clarify such features. In like manner, although the figures are presented using rectilinear outlines, one of skill in the art will recognize that the presented shapes are not limited to rectangular structures.

Figure 1A:
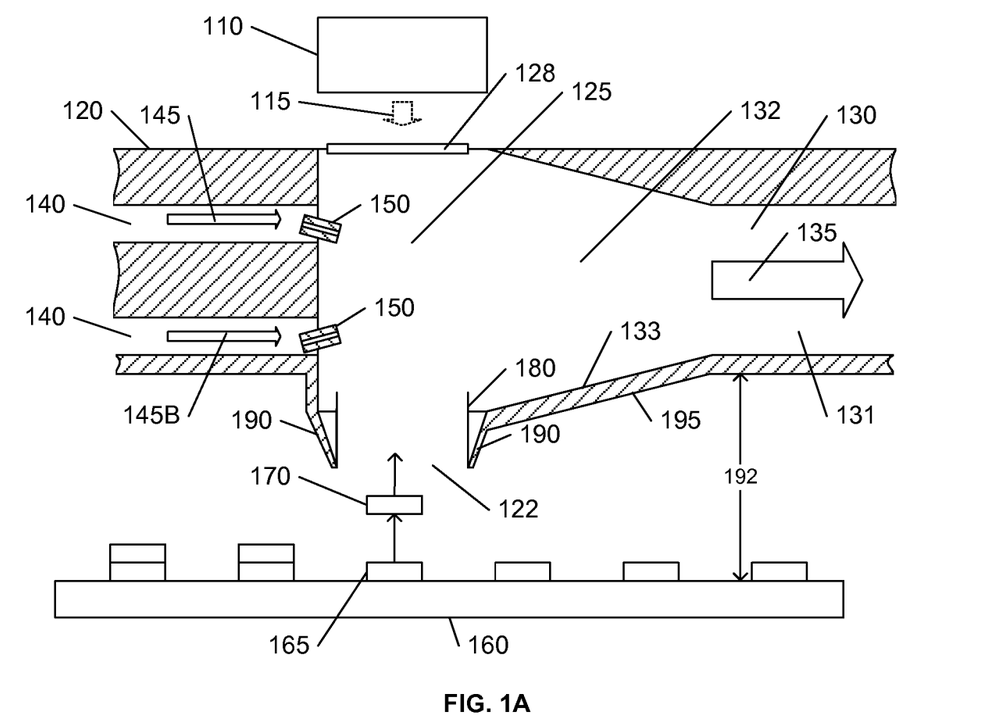
FIG. 1A illustrates an example Sapphire Collector that substantially reduces the likelihood of mechanical damage to the light emitting element after laser lift-off.

FIG. 1A illustrates a Sapphire Collector (SC) 120, as disclosed in U.S. Provisional Application 62/038,988, filed Aug. 19, 2014; and now PCT Application No. PCT/IB2015/055712, filed Jul. 29, 2015, which is incorporated by reference herein. The SC 120 includes a collection cavity 125 that is open to a tunnel 130. The tunnel 130 is under negative pressure, causing vacuum flow 135 into the tunnel. The SC 120 also includes input pipes 140 to the cavity 125 that provide air under pressure 145 in pipes 140 respectively. Additional tunnels and pipes may also be provided.

A laser element 110 provides a pulsed laser beam 115 that enters SC 120 via a gate 128. The gate 128 is designed so as not to block the laser beam 115, but to prevent the escape of any sapphire chips 170 after they enter the cavity 125. The gate 128 may be, for example, a lens element, or simply a grate.

Below the SC 120, a plurality of light emitting elements 165 with attached sapphire substrate chips 170 are mounted on a submount 160. During laser lift-off, the SC 120 is situated over a light emitting element 165 with an attached sapphire chip 170, either by moving SC 120 relative to the submount 160, or moving the submount 160 relative to the opening 122 to the cavity 125 of SC 120.

With the light emitting element 165 and chip 170 situated beneath the opening 122, the pulsed laser beam 115 is applied, causing the chip 170 to be explosively released from the light emitting element 165. The upward force causes the released chip 170 to enter the opening 122 and the vacuum flow 135 causes it to travel toward the tunnel 130. The pressurized air flows 145 exiting the pipes 140 also serve to push the traveling chip 170 toward the tunnel 130.

Depending upon the initial liftoff trajectory direction and velocity of the chip 170 relative to the vacuum flow 135 and pressurized air 145, the chip 170 may enter the vacuum tunnel 130 directly, or after a few ricochets. Ideally, even if the chip 170 ricochets around within the cavity 125, the chip 170 will eventually enter the tunnel 130 because its velocity will be continually decreasing, and thus increasingly more influenced by the vacuum flow 135 and pressurized air flows 145.

The inventors have recorded the laser lift-off operation with respect to the submount 160 and the opening 122 using a high speed camera, and have observed that some chips 170 exit the opening 122 and cause damage.

Figure 1B:
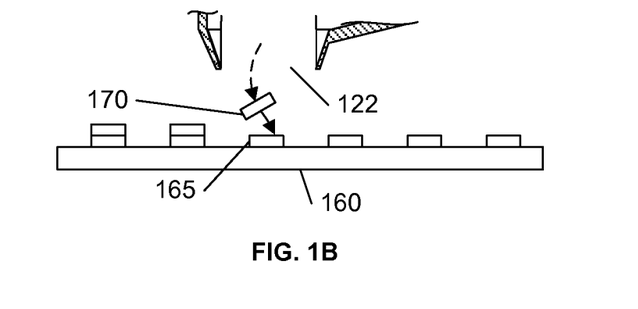
FIGS. 1B and 1C illustrate examples of adverse travel of a sapphire chip in the Sapphire Collector of FIG. 1A.

In some cases, the chips 170 are hovering below the opening 122 and are eventually sucked back into the cavity 125, causing no adverse effects. In other cases, however, the chips 170 are traveling at a sufficient downward speed that the vacuum flow 135 and pressurized air flows 145 is insufficient to reverse or alter its direction before it exits the opening 122 and strikes the submount 160, as illustrated in FIG. 1B. The likely cause of this downward travel is a ricochet of the chip 170 off the walls or top surface of the cavity 125. Most ricocheting chips 170 are likely to eventually be sucked into the tunnel 130, due to the vacuum flow 135 and the pressurized air flows 145, but some chips 170 escape through the opening 122 and strike the sub-mount 160 with mounted light emitting elements 165.

If the exiting chip 170 strikes the submount 160 at a location where the light emitting element 165 is situated without an attached sapphire chip 170 (i.e. elements 165 with chips 170 laser removed), even at a low speed, the fragile nature of the semiconductor surface will likely result in the destruction of the element 165.

Figure 1C:
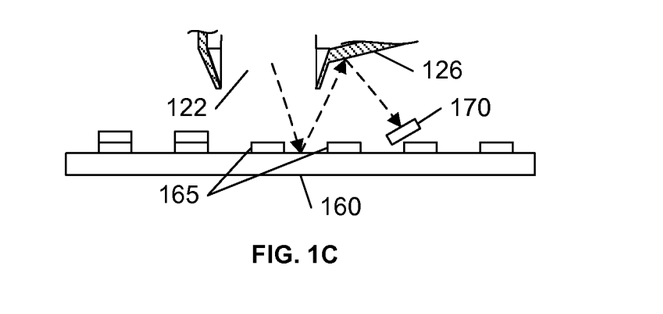

FIG. 1C illustrates an observed failure mechanism wherein the exiting chip 170 ricochets repeatedly between the lower exterior surface 126 of SC 120 and the submount 160, causing substantial damage, often to multiple elements 165 on the submount 160.

As noted above, the yield loss due to mechanical damage after laser lift-off in the prior art has been observed in one set of production runs to amount to 0.236% due primarily to the damage that exiting chips 170 inflict. The enhanced Sapphire Collector 120 of FIG. 1A has reduced the yield loss due to mechanical damage after laser lift-off by an order of magnitude, from 0.236% to 0.023%. However, given the ever increasing competitive market for light emitting devices, even this low yield loss may have a significant effect on the profit margin for these devices.

Through the use of Computational Fluid Dynamics (CFD), and the use of a high speed (750 fps) camera and a Sapphire Collector created with transparent walls, the inventors have discovered that a substantial majority of the chips 170 strike the upper surface of the cavity 125, with few, if any, chips 170 entering the tunnel 130 directly.

The inventors subsequently determined that the chips 170 enter the cavity 125 at a high rate of vertical velocity (28 m/s or more), and that turbulence within cavity 125 reduces the effectiveness of the air pushers 150 and the vacuum 135.

Figure 2:
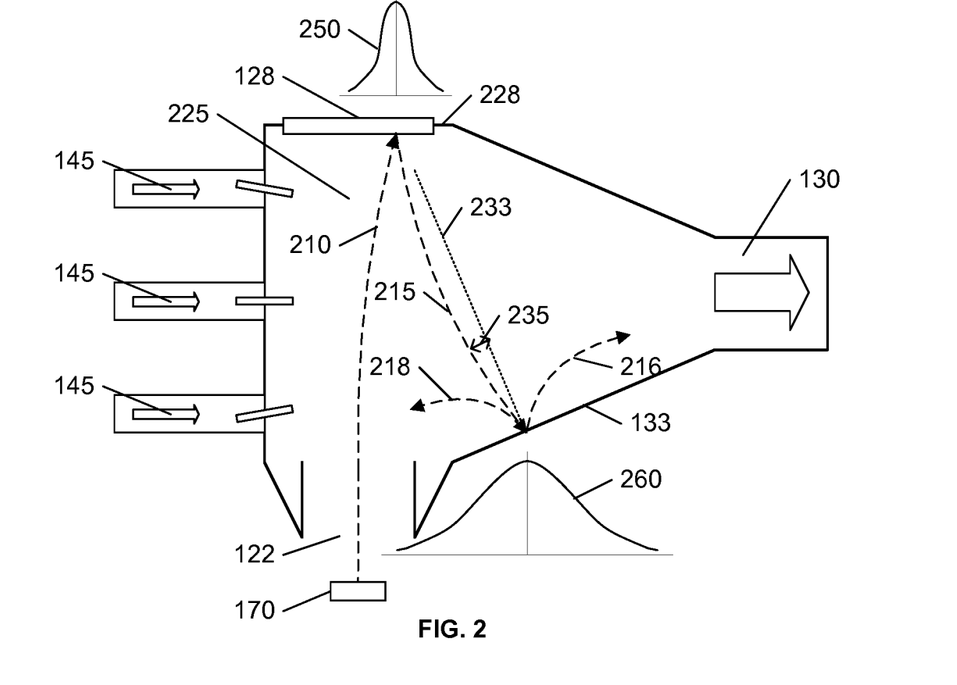
FIG. 2 illustrates an example distribution of trajectories of chips within the Sapphire Collector of FIG. 1A.

FIG. 2 illustrates an example distribution of trajectories of chips within an example Sapphire Collector, as determined by simulation and observation through a transparent cavity 225. In this example SC, three airflows 145 are provided.

Due to a high liftoff velocity (~28 m/s), virtually all of the chips 170 strike the mesh 128 on the upper surface 228 of the cavity 225, as illustrated by the median path 210 and example distribution 250 of the striking location on the mesh. After striking the mesh 128, the chips ricochet and travel via median path 215 to the flared portion 133 of the tunnel 130. As illustrated by the example distribution 260, the chips strike the flared portion 133 across a broader range than the distribution 250 of initial striking locations.

Ricochet paths 216, 218 are intended to illustrate the fact that a majority of the chips 170 travel via median path 216 toward the tunnel 130, due to the angle of incidence 235 at which the chips strike the surface 133, relative to a normal 233 to the surface of the flared portion 133. Many chips 170, however, ricochet back via median path 218 toward the opening 122, and there is a possibility that a few of these chips 170 will exit the opening 122, likely causing damage to the unprotected chips 165 on the submount 160, as illustrated in FIGS. 1B, 1C.

FIGS. 3A-3D illustrate example embodiments of a Sapphire Collector that further substantially reduces the likelihood of mechanical damage to the light emitting element after laser lift-off. As noted above, these embodiments are not drawn to scale.

Figure 3A:
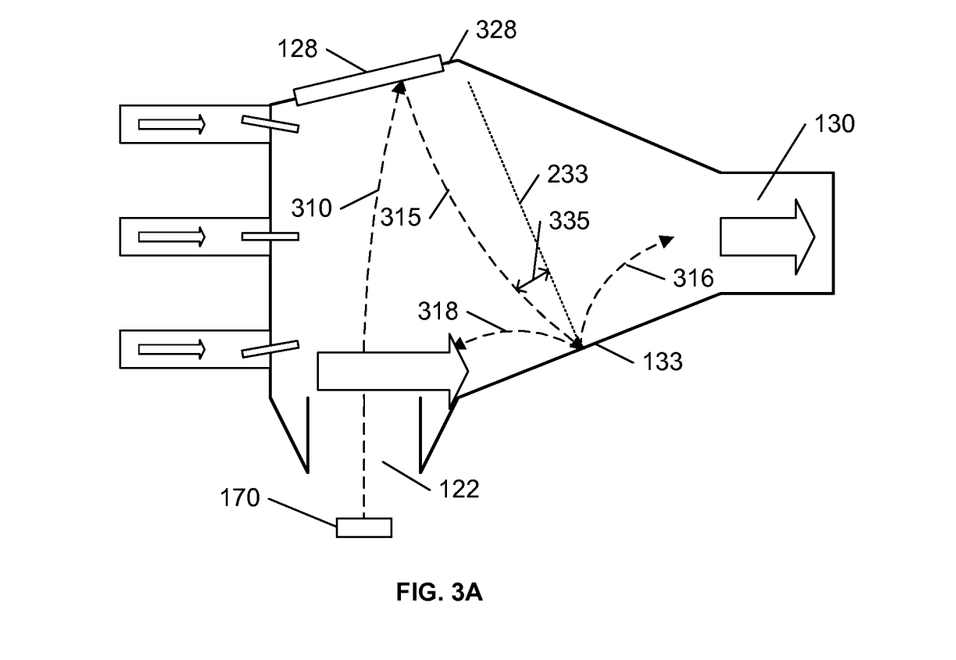
FIGS. 3A-3D illustrate example embodiments of a Sapphire Collector that further substantially reduces the likelihood of mechanical damage to the light emitting element after laser lift-off.

As illustrated in FIG. 3A, the top surface 328 of the cavity may be tilted to increase the ricochet angle toward the tunnel 130. As contrast to the SC of FIG. 2, the median path 310 of the chips 170 that enter the opening 122 is substantially the same as the median path 210 of FIG. 2. However, as illustrated by the median ricochet path 315, the sloped upper surface 328 causes the chips 170 to strike the flared portion 133 closer to the tunnel 130, and at a greater angle of incidence 335 relative to the normal 233. The increased angle of incidence 335 results in a greater number of chips 170 ricocheting via median path 316 toward the tunnel 130, and fewer chips 170 ricocheting via median path 318 toward the opening 122.

Figure 3B:
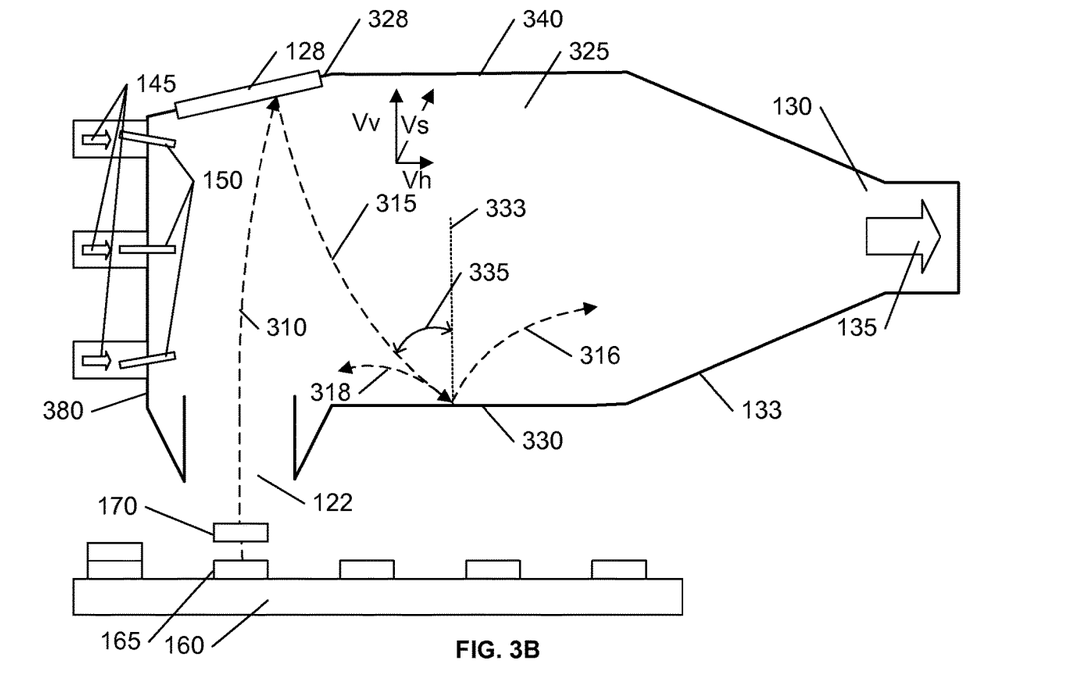

As illustrated in FIG. 3B, if an extended lower surface 330 is provided in the cavity 325, the angle of incidence 335 of the chips along path 315 is further increased relative to a normal 333, because the chips strike a surface 330 that is parallel to the submount 160, rather than the flared portion 133 of the tunnel 130 that is tilted toward the opening 122. Due to this greater angle of incidence 335, more chips 170 ricochet via median path 316 toward the tunnel 130, and fewer chips 170 ricochet via median path 318 toward the opening 122.

As noted above, the illustrations are not to scale, and certain features are drawn oversized to enable annotations and other elements that clarify such features. In an example embodiment, the length of the extended lower surface 330, between the front wall 380 and the flared portion 133 of the tunnel 130, is at least five times the length of the opening 122.

To further decrease the number of chips 170 that exit the opening 122, the pressure of the air flows 145, and the vacuum 135 of the tunnel 130 may be adjusted to increase the horizontal velocity Vh of the chips 170 within the cavity 325 and/or decrease their vertical velocity Vv. As expected, increasing the pressure and volume of the air flows 145 increases the horizontal velocity Vh of the chips 170 along the paths 310, 315. Of particular note, it was found that providing a larger air blade opening to increase the volume of air had a more positive effect than using a thin air blade opening to influence the horizontal velocity Vh of chips 170. In an example embodiment, with an air blade opening of about 0.2 mm+/−0.05 mm, the pressure of the air flows 145 may be at least 0.3 MPa, and preferably over 0.4 MPa.

Unexpectedly, however, decreasing the vacuum 135 of the tunnel 130 serves to increase the horizontal trajectory of the chip along the paths 310, 315. The inventors have determined that the magnitude of the vacuum 135 influences the vertical component Vv of the chip's velocity V substantially more than it influences the horizontal component Vh. This increase in vertical velocity Vv reduces the ability of the air flow from the air blades 150 to offset the path 310 of the chips 170 as they travel toward the upper surface 328. Preferably, the vacuum 135 is maintained at a minimum level necessary to assure that chips 170 that arrive at the tunnel 130 continue to travel through the tunnel 130 to a collection repository (not illustrated) at the other end of the tunnel 130. Depending upon the proximity of the repository, this minimum vacuum could be as low as −0.2 kPa. In an example embodiment, the magnitude of the vacuum 135 is maintained at less than −3.0 kPa, and preferably less than −1.5 kPa. (With regard to pressure, the polarity refers to the direction ("−"="toward the source of the vacuum", "+"="from the source of the pressure"). A vacuum of −1.5 kPa is "less than" a vacuum of −3.0 kPa.)

Figure 3C:
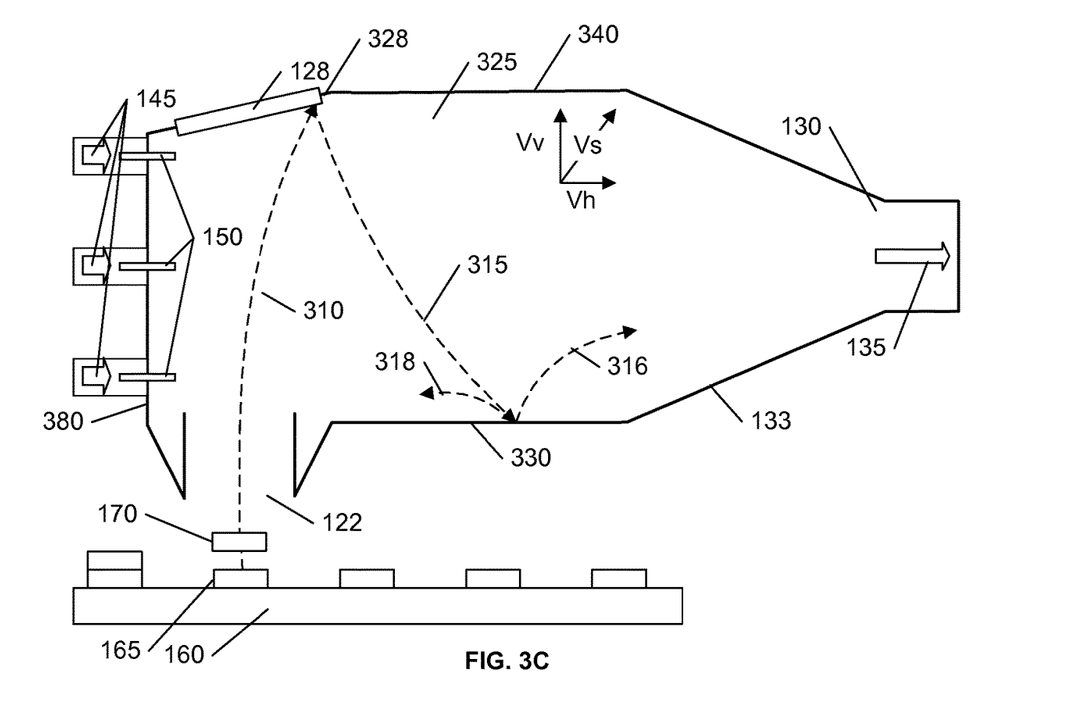

With a reduced vacuum 135, the vertical velocity Vv of the chips 170 as they enter the opening 122 may be reduced from the aforementioned 28 m/s to about 19 m/s. With this reduced velocity Vv, the duration of the trip from the opening 122 to the upper surface 340 is longer, allowing the air flow from the air blades 150 to have more time to influence the horizontal trajectory of the chips 170 as they travel along paths 310, 315. In an example embodiment, this increase in the horizontal travel of the chips along path 310 results in the chips 170 striking the edge of the top mesh 128 further away from the front wall 380 of the cavity 325, toward the tunnel 130, and at a greater angle of incidence with the top mesh 128, as illustrated in FIG. 3C. This correspondingly causes the chips 170 to strike the lower surface 330 closer to the tunnel 130, also at a greater angle of incidence, thereby further reducing the number of chips 170 that ricochet via median path 318 toward the opening 122.

The inventors have also discovered that turbulence within the cavity 325 reduces the effectiveness of the air flows' 145 ability to offset the paths 310, 315 of the chips 170 toward the tunnel 130. To reduce this turbulence, the air blades 150 may be oriented to be parallel to the lower surface 330 of the cavity 325, as also illustrated in FIG. 3C, rather than oriented to point to the tunnel 130 as in the example SC of FIG. 2 or as is shown in other figures, such as FIG. 3B.

The turbulence within the cavity 325 as well as the vertical velocity Vv of the chips as they enter to opening 122 may be further reduced by minimizing the upward draft on the chips 170 caused by the vacuum 135 drawing air up through the opening 122. In an example embodiment, one or more of the walls of the cavity 325 allow air to be drawn into the cavity 325, reducing the air that is drawn into the cavity 325 via the opening 122. In some embodiments, as illustrated in FIG. 4, the front wall 380 and at least a portion of each side wall 410 and the upper 340 and lower 330 surfaces of the cavity (325 of FIG. 3D) include a mesh structure 485, 415, 445, 435, respectively, that allows air to freely enter the cavity 325. The mesh may be any pattern, such as square, rectangle, diamond, circle, honeycomb, and so on, sufficiently sized to prevent the chips 170 from escaping the cavity 325 other than via the tunnel 130.

With sufficient free air flow into the cavity 325, the vertical velocity Vv of the chips 170 as they enter the opening 122 is approximately equal to the velocity induced by the explosive laser lift-off process, which may be about 12 m/s, substantially lower than the aforementioned 28 m/s associated with the SC of FIG. 2. This significant reduction in the vertical velocity Vv due to the meshed wall design 485, 415, 445 and 435, together with the significant increase in the horizontal velocity Vh due to increased air flow 145 from widened air blades 150, results in the chips 170 turning away from the top mesh 128 and towards the tunnel 130. As a result, chips 170 strike the upper surface 340 of the cavity 325 at a greater angle of incidence with the upper surface 340, as illustrated in FIG. 3D.

The turbulence in the cavity 325 may be further reduced by providing a larger egress for the air that is being provided by the air blades 150. In an example embodiment, the flared portion 133 of the tunnel 130 (FIG. 3D) may also comprises a mesh structure, which allows a substantial portion of the air from the air blades 150 to freely escape. In like manner, the entire extended portion 330, 340 of the SC may comprise a mesh structure.

Figure 3D:
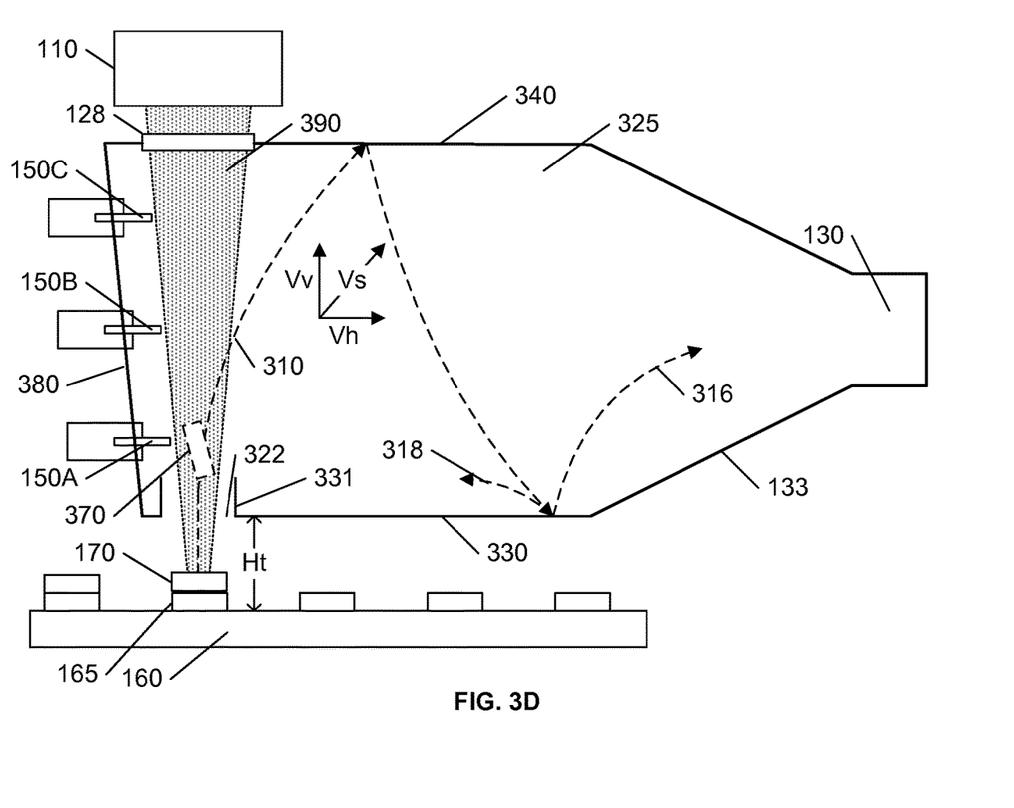
Figure 4:
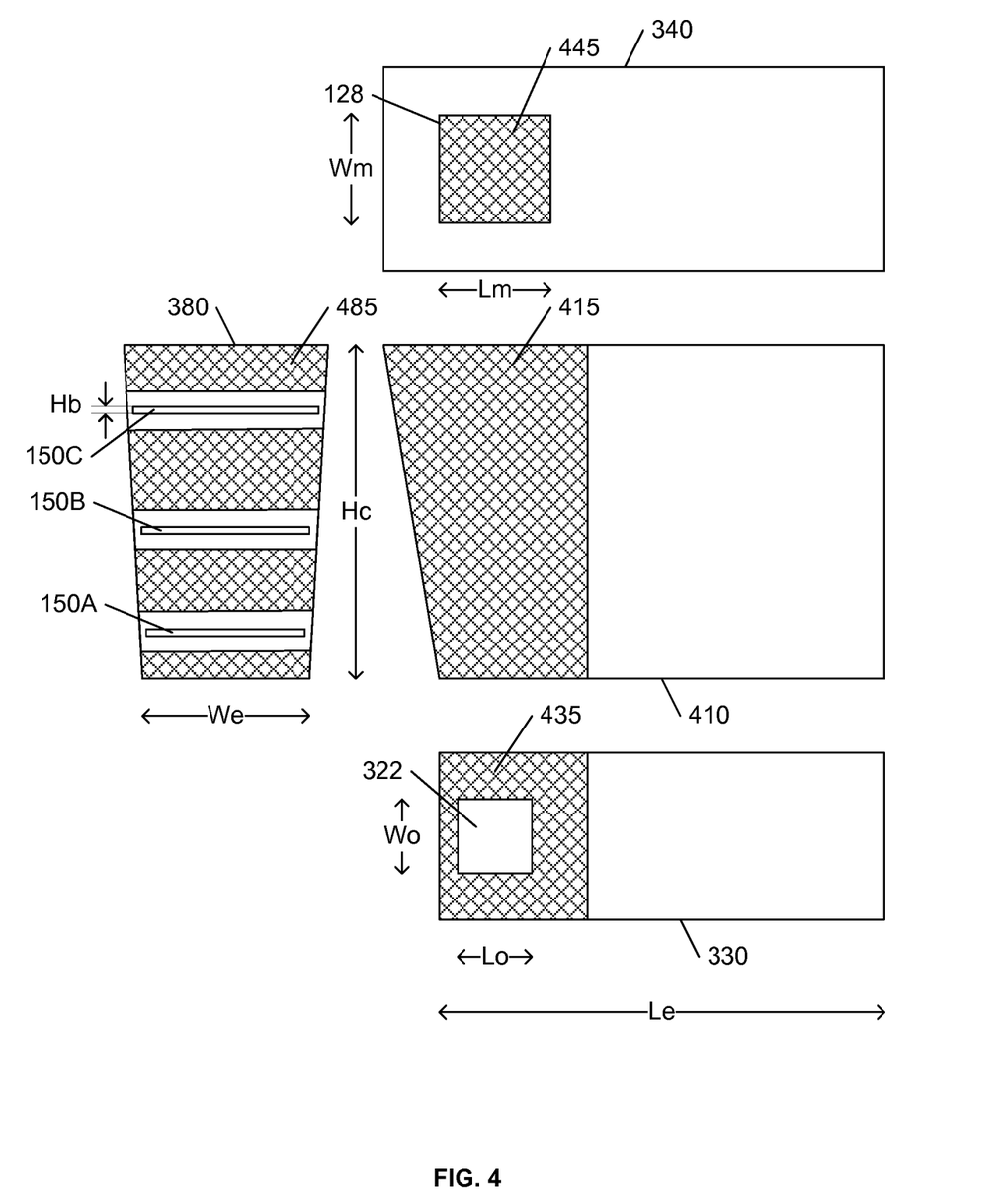
FIG. 4 illustrates example features and dimensions of the Sapphire Collector of FIG. 3D.

As illustrated in FIG. 3D and FIG. 4, an increase in the horizontal velocity Vh of the chip 170 may also be achieved by tilting the front wall 380 of the cavity 325 so that the air blade 150A closest to the opening 322 is closer to the vertical path of the chip 170 than the air blades 150B, 150C that are farther from the opening 322.

The laser beam 390 that induces the laser liftoff is focused on the chip 170 upon the submount 160, and thus is broader at the mesh 128 than it is at the opening 322. By sloping the front wall 380, the air blades 150A, 150B, 150C may be situated as close to the path 310 of the chip 170 without interfering with the (tapered) path of the laser 390.

In like manner, as illustrated in FIG. 4, the front wall 380 of the cavity 325 may be tapered to allow wider air blades 150C, 150B, 150A as the distance from the opening 122 increases.

Also illustrated in FIG. 4 are dimensions that may have nominal values as illustrated in the following table. Other dimensions may be selected based on these nominal values, or their actual values. For example, the width of the air blade 150 may be as large as possible, based on the width of the extended surface 330 We and the degree of taper of the front surface 380.

| Lo, Wo | Length and Width of Opening 322 | 7 mm, 7 mm |
| Lm, Wm | Length and Width of Mesh 128 | 18 mm, 18 mm |
| Le, We | Length and Width of extended surface 330 | >5xLo, >Wo |
| Hc | Height of cavity 325 | 80 mm |
| Hb | Height of air blade 150 orifice | 0.2 mm |

Returning to FIG. 3D, with a reduced likelihood of a chip 170 re-entering the vicinity of the opening 322, the tapered opening 122 of the SC of FIG. 2 is no longer required, provided that the height Ht of the opening 322 above the substrate 160 enables the chip 170 to travel past the first air blade 150A. The height of the bather 331 may be between 1-3 times the size of the chip 170, to prevent chips 170 that may accumulate on the lower surface 330 from falling into the opening 322.

The horizontal velocity Vh of the chips 170, particularly along the path 310, is strongly influenced by the orientation of the chip 170 as it encounters the airflow from the first air blade 150A in the cavity 325. If a major surface (i.e. top or bottom surface, rather than the edges) 370 of the chip 170 is oriented within about 30 degrees of perpendicular (as illustrated) to the airflow of the first air blade 150A when it encounters the airflow, its horizontal velocity Vh will be strongly influenced. If the major surface 370 of the chip 170 is oriented parallel (not illustrated) to the airflow of the air blade 150A, the influence of the airflow on the chip is substantially reduced.

Although one might expect the orientation of the chip 170 when it encounters the first airflow to be random, the applicants have discovered that the height Ht of the opening 322 over the submount 160 exhibits a strong correlation with the orientation of the chip when it encounters the airflow of the first air blade 150A. In some embodiments, the height Ht is adjustable, and a trial-and-error adjustment is made until a suitable horizontal velocity Vh is achieved, as determined, for example, by observing where most of the chips 170 strike the upper 340 and lower 330 surfaces of the cavity 325 (closer to the tunnel 130 being preferred). In an example embodiment, with an initial vertical velocity of about 12 m/s caused by the laser liftoff, a height Ht of about 6 mm+/−0.5 mm provides an optimal horizontal velocity Vh.

While the invention has been illustrated and described in detail in the drawings and foregoing description, such illustration and description are to be considered illustrative or exemplary and not restrictive; the invention is not limited to the disclosed embodiments.

For example, although the cavity 325 is illustrated herein as a rectilinear structure, one of skill in the art will recognize that other shapes may be used. For example, the portion of the cavity 325 that is located between the opening 322 and the flared portion 133 of the tunnel 130 may transition from a rectangular shape to a more cylindrical shape to couple to a cylindrical tunnel 130. In like manner, although the tunnel 130 is illustrated as having a smaller cross-sectional area than the cavity 325, it may have a similar cross-sectional area, or an even larger cross-sectional area than the cavity 325. Similarly, the deflection screen 128 may be slanted as illustrated in FIGS. 3B, 3C.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:
1. A collector system comprising:
   a container comprising:
      a top surface defining a first opening,
      a plurality of side surfaces, a first side surface of the plurality of side surfaces defining a plurality of second openings,
      a bottom surface defining a third opening, the bottom surface having a section adjoining the third opening on a side opposite the first side surface, and a length of the bottom surface from the first side surface to an end of the section is at least five times greater than a length of the third opening from the first side surface to a beginning of the section,
      a cavity extending through the container between the first opening and the plurality of second openings,
      a plurality of tunnels extending, respectively, between the plurality of second openings and the cavity, and
      a plurality of air pushers at least partially in one of the plurality of tunnels, respectively.

2. The system of claim 1, wherein a section of the top surface above the third opening is sloped relative to a section of the top surface that is parallel with the bottom surface.

3. The system of claim 1, wherein at least one of the top surface, the bottom surface and the first side surface include a mesh structure.

4. The system of claim 1, wherein the plurality of air pushers are a plurality of air knives, each having an opening between 0.15mm and 0.25mm.

5. The system of claim 1, wherein the plurality of air pushers are parallel with the bottom surface of the container.

6. The system of claim 1, wherein the plurality of side surfaces further comprises a second side surface defining a fourth opening, and the container further comprises another tunnel extending between the second side surface and the cavity.

7. The system of claim 6, wherein a magnitude of a vacuum in the tunnel is less than −1.5kPa.

8. The system of claim 6, wherein the top surface and the bottom surface each comprise a second section that slopes inward from the first section and meets with the tunnel to form a sloped section of the cavity.

9. The system of claim 8, wherein the sloped section of the cavity comprises a mesh structure.

\* \* \* \* \*